(12) United States Patent
Wootten

(10) Patent No.: US 9,250,070 B2
(45) Date of Patent: Feb. 2, 2016

(54) RUGGED THREE-AXIS INCLINOMETER

(76) Inventor: Keith Robert Wootten, Reading (GB)

( * ) Notice: Subject to any disclaimer, the term of this patent is extended or adjusted under 35 U.S.C. 154(b) by 431 days.

(21) Appl. No.: 13/297,752

(22) Filed: Nov. 16, 2011

(65) Prior Publication Data

US 2013/0119995 A1 May 16, 2013

(51) Int. Cl.
*G01R 33/02* (2006.01)
*G01C 9/20* (2006.01)
*G01R 33/09* (2006.01)
*E21B 47/022* (2012.01)
*G01R 33/12* (2006.01)

(52) U.S. Cl.
CPC ............. *G01C 9/20* (2013.01); *E21B 47/022* (2013.01); *G01R 33/098* (2013.01); *G01R 33/1284* (2013.01)

(58) Field of Classification Search
CPC .......................... G01R 33/098; G01R 33/1284
USPC ...................... 324/252, 260, 207.21
See application file for complete search history.

(56) References Cited

U.S. PATENT DOCUMENTS

| | | | |
|---|---|---|---|
| 4,614,041 A * | 9/1986 | Darton et al. | ................... 33/313 |
| 4,667,414 A | 5/1987 | Russell | |
| 5,780,741 A | 7/1998 | Raj | |
| 2008/0047154 A1 | 2/2008 | Steinich | |
| 2008/0272771 A1 | 11/2008 | Guo et al. | |

OTHER PUBLICATIONS

Okada T et al.; Smart Sensing of Both the Direction of Acceleration and Azimuth Utilization a Slim Permanent Magnet Floating in a Spherical Vessel; IMTC 2000, Proceedings of the 17th IEEE Instrumentation and Measurement Technology Conference; Baltimore, MD, May 1-4, 2000.
Okada T et al.; Smart Sensing of Both the Direction of Acceleration and Azimuth Utilization a Slim Permanent Magnet Floating in a Spherical Vessel; Proceedings of the 15th IMEKO World Congress; Jun. 10-18, 1999; Tokyo & Osaka, Japan, International Measurement Confederation (IMEKO); The Society of Instrument and Control Engineers (SICE), Japan, Jan. 1, 1999.
European Search Report; Application No. EP 12192639; Jun. 17, 2015.

* cited by examiner

*Primary Examiner* — Reena Aurora
(74) *Attorney, Agent, or Firm* — Crowe & Dunlevy

(57) ABSTRACT

A method and apparatus for a rugged three-axis inclinometer for determining an object's orientation with respect to a gravitational field. Components of the apparatus include but not limited to a magnet, a non-magnetic casing, a ferrofluid, one or more non-magnetic gravitational field aligning materials attached to the magnet and a plurality of angle sensors attached to the non-magnetic casing. In this regard, when the apparatus is rotated, the gravitational field aligning materials maintain a constant orientation of the magnet and the angle sensors experience different magnetic field strengths as they rotate around the magnet. The position of the apparatus, with respect to the gravitational field can then be calculated based on the angle sensor outputs.

16 Claims, 4 Drawing Sheets

RUGGED THREE-AXIS INCLINOMETER

TECHNICAL FIELD

Embodiments of the subject matter disclosed herein generally relate to methods and devices for determining orientation and, more particularly, to mechanisms and techniques for determining an object's orientation with respect to a gravitational field.

BACKGROUND

Determining the orientation of a device with respect to gravity is typically accomplished by attaching accelerometers to the device and performing calculations on the output of the accelerometers. These types of orientation measurement devices are known as inclinometers. Example applications of the use of this technology are digital cameras, cell phones and game controllers. Another example of an application desiring a method to determine a device orientation with respect to gravity is the bit end of a downhole drilling device for the oil and gas industry. In the downhole drilling application, it is important to know the orientation of the drill bit to assure the safety and integrity of the drilling operation.

The currently available designs result in several problems experienced during operation in a downhole well drilling operation. First, the operating temperature in a downhole well drilling application exceeds the operating temperature ranges of available accelerometers. Second, and more importantly, the operating environment of a downhole well drilling application includes vibration and shock events that would damage and/or disable available accelerometers, rendering them useless for determining the device orientation with respect to gravity.

Accordingly, it would be desirable to provide devices and methods that avoid the afore-described problems and drawbacks.

SUMMARY

According to one exemplary embodiment, an apparatus for measuring orientation with respect to gravity comprises a magnet assembly further comprising a magnet and one or more non-magnetic gravitational alignment materials attached to the magnet. Continuing with the exemplary embodiment, the apparatus has a non-magnetic casing with a cavity for enclosing the magnet assembly and a ferrofluid. Further in the exemplary embodiment, a plurality of angle sensors are attached to the non-magnetic casing for measuring a magnetic field associated with the magnet.

According to another exemplary embodiment, there is a well logging tool comprising a sensor assembly for collecting data from a well bore, an orientation measuring apparatus and a casing for enclosing the sensor assembly and the orientation measuring apparatus. The orientation measuring apparatus further comprises a magnet assembly comprising a magnet and one or more non-magnetic gravitational alignment materials attached to the magnet, a non-magnetic casing with a cavity for enclosing the magnet assembly, a ferrofluid enclosed in the cavity and encasing the magnet assembly and a plurality of angle sensors, attached to the non-magnetic casing, for measuring a magnetic field associated with the magnet.

According to another exemplary embodiment, there is a method for measuring orientation with respect to a gravitational field. The exemplary method embodiment comprises creating a magnet assembly by attaching one or more non-magnetic gravitational alignment materials to a magnet, attaching a plurality of angle sensors to a non-magnetic casing, inserting the magnet assembly in a cavity in the non-magnetic casing, encasing, in the cavity, the magnet assembly with a ferrofluid, sealing the cavity to contain the magnet assembly and the ferrofluid and reading the plurality of angle sensors outputs and calculating an orientation based on the outputs.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of a rugged three-axis inclinometer based on a ferrofluid encapsulated magnet.

Reference throughout the specification to "one embodiment" or "an embodiment" means that a particular feature, structure, or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
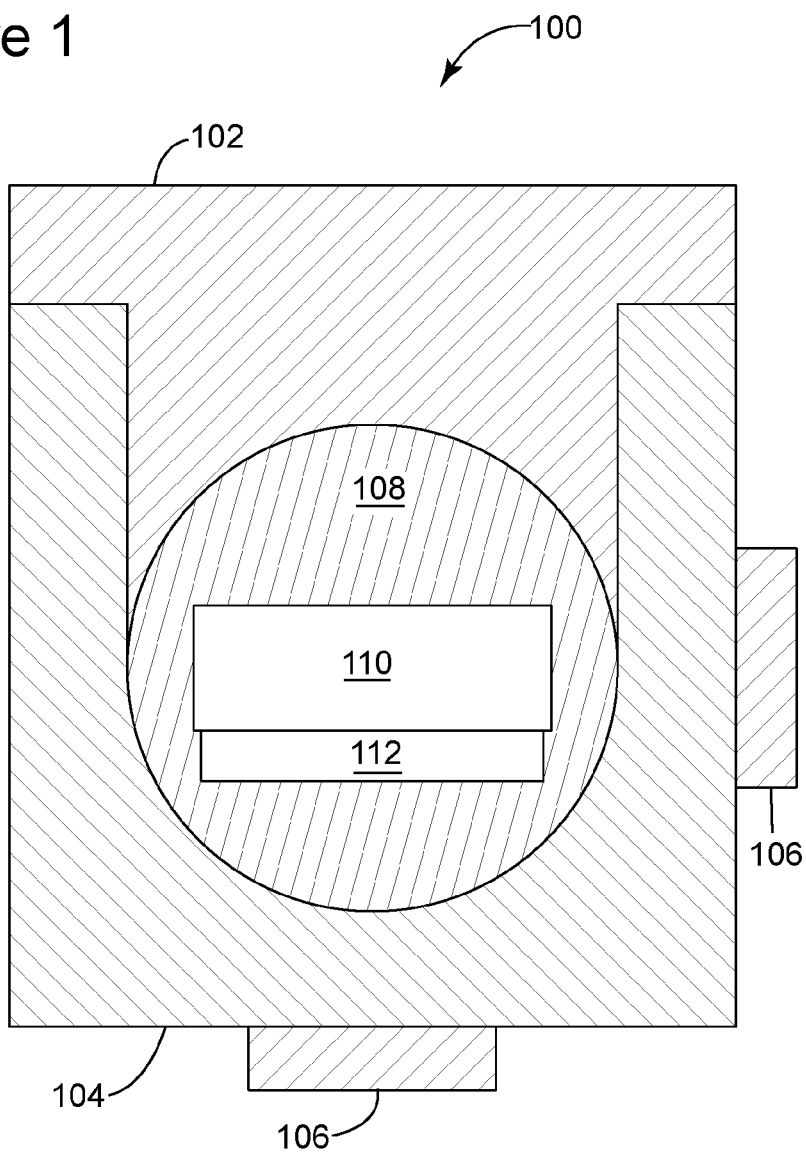
FIG. 1 is an exemplary embodiment of a rugged three-axis inclinometer based on a ferrofluid encapsulated magnet, with an attached non-magnetic weight, in a non-magnetic cavity.

Looking now to FIG. 1, an exemplary embodiment depicts a cross section of a rugged three-axis inclinometer 100. In the exemplary embodiment, the rugged three-axis inclinometer 100 includes a non-magnetic casing 102, 104, angle sensors 106, ferrofluid 108, a magnet 110 and a non-magnetic weight 112. It should be noted that one of the angle sensors is not shown due to the cross sectional nature of FIG. 1, the third angle sensor would be on the end of the casing 102, 104 in the plane of the cross section.

Continuing with the exemplary embodiment, the casing 104 is constructed of a non-magnetic material and has a spherical cavity for holding the ferrofluid 108, magnet 110 and the weight 112 attached to the magnet. Next in the exemplary embodiment, the casing 102, 104 is constructed of a non-magnetic material. Casing 102 has a spherical cavity that matches the spherical cavity of the casing 104. Continuing with the exemplary embodiment, the casings 102, 104 will fit together and form a spherical cavity that seals and prevents the ferrofluid from leaking out of the spherical cavity. It should be noted in the exemplary embodiment that the shape of the cavity in the casing 102, 104 is not limited to a sphere, other shapes can be employed based on factors such as but not limited to the shape of the magnet 110. It should also be noted in the exemplary embodiment that the casing 102, 104 can be constructed from materials such as but not limited to plastic and aluminum. Further in the exemplary embodiment, three angle sensors 106 are attached to the sides of the casing 102, 104 in a three-axis arrangement for detecting changes in the position of the magnet based on changes in magnetic field strength. It should be noted that only two of the angle sensors are shown in the rugged three-axis inclinometer because of the cross-sectional view. It should be noted in the exemplary embodiment that the angle sensors 106 can be Tunneling Magnetoresistance (TMR) sensors, also known as Spin-Dependent Tunneling (SDT), Magnetic Tunnel Junction (MTJ) or Tunneling Magnetic Junction (TMJ) sensors. TMR sensors, based on a spintronic quantum effect that produces a dramatic resistance change in a normally insulating layer, depending on a magnetic field and thus the predominant electron spin in a free layer, are well known in the art, as illustrated by United States Patent Application number 2008/0272771 included herein by reference.

Continuing with the exemplary embodiment, a ferrofluid 108 is constrained in the spherical cavity created by casing 102 and casing 104. The ferrofluid is attracted to the magnet and forms a nearly friction-free well-lubricated encasement of the magnet, while further centering the magnet in the cavity containing the ferrofluid. It should be noted in the exemplary embodiment that a ferrofluids are colloidal liquids comprised of nanoparticles in a carrier fluid. Ferrofluids are well known in the art, as illustrated by U.S. Pat. No. 3,215,572 included herein by reference.

Next in the exemplary embodiment, a magnet 110 is located inside the cavity created by casing 102 and casing 104. In one exemplary embodiment, the magnet is cylindrical in shape. It should be noted in the exemplary embodiment that the magnet can be other shapes, based on factors such as but not limited to the shape of the cavity created by casing 102 and casing 104. Further in the exemplary embodiment, a non-magnetic weight 112 is attached to the magnet 110. In the exemplary embodiment, the non-magnetic weight 112 keeps the magnet 110 oriented in a direction with a cylindrical cross-sectional face perpendicular to the gravitational force regardless of the orientation of the casing 102,104. It should be noted in the exemplary embodiment that the non-magnetic weight 112 can be any shape suitable for the application, including but not limited to cylindrical, hemispherical, oval, rectangular, etc. and can be constructed of any non-magnetic material denser than the ferrofluid, such as but not limited to lead or solder.

Continuing with the exemplary embodiment, as the casing 102, 104 is rotated in any direction, the TMR sensors 106 rotate around the stationary magnet and experience changing magnetic field angles, based on the movement of the TMR sensors 106 with respect to the magnet 110. Here reference is made to magnetic field angles, rather than magnetic field strength, since the TMR sensors 106 operate in saturation such that above a predetermined threshold the TMR sensors 106 are sensitive to the magnetic field angles rather than magnetic field strength. The output from the TMR sensors can then be used to calculate the orientation of the casing 102, 104 with respect to the direction of the gravitational field aligning the weight 112 and the magnet 110. This orientation can then be transposed to the orientation of the desired device, such as a drill head, based on how the casing 102, 104 is mounted and aligned with respect to the device.

Figure 2:
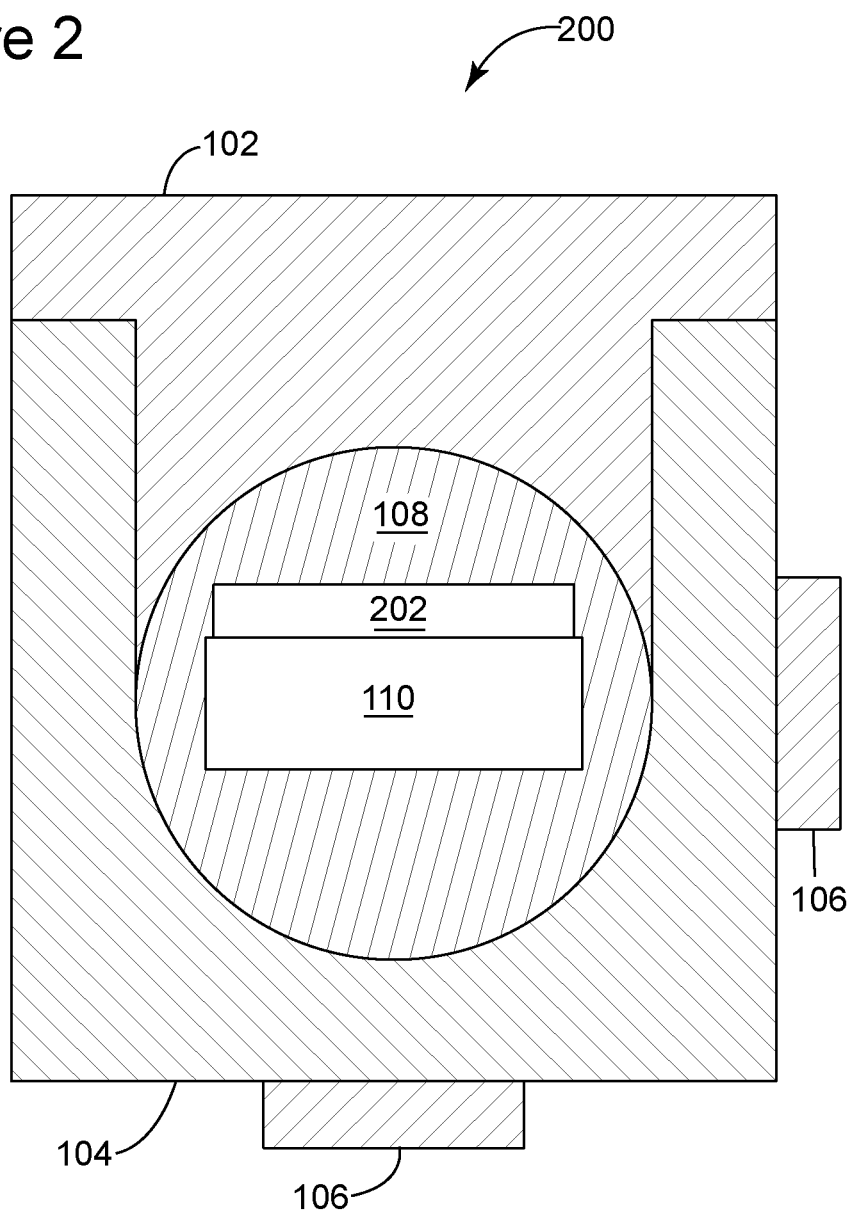
FIG. 2 is an exemplary embodiment of a rugged three-axis inclinometer based on a ferrofluid encapsulated magnet, with an attached non-magnetic float, in a non-magnetic cavity.

Looking now to FIG. 2, an exemplary embodiment depicts a cross section of a rugged three-axis inclinometer 200. In the exemplary embodiment, the rugged three-axis inclinometer 200 includes a non-magnetic casing 102, 104, angle sensors 106, ferrofluid 108, a magnet 110 and a non-magnetic float 202. It should be noted that one of the angle sensors is not shown due to the cross sectional nature of FIG. 2, the third angle sensor would be on the end of the casing 102, 104 in the plane of the cross section.

Continuing with the exemplary embodiment, the rugged three-axis inclinometer 200 is identical to the rugged three-axis inclinometer 100 described above, with the exception that the magnet 110 is attached to a float 202 instead of the weight 112. The exemplary embodiment float 202 provides the same gravitational field orienting capability as the weight 112 but exerts the buoyant force in the opposite direction from the weight 112. It should be noted in the exemplary embodiment that the float can be constructed of any non-magnetic material less dense than the ferrofluid such as but not limited to plastic.

Figure 3:
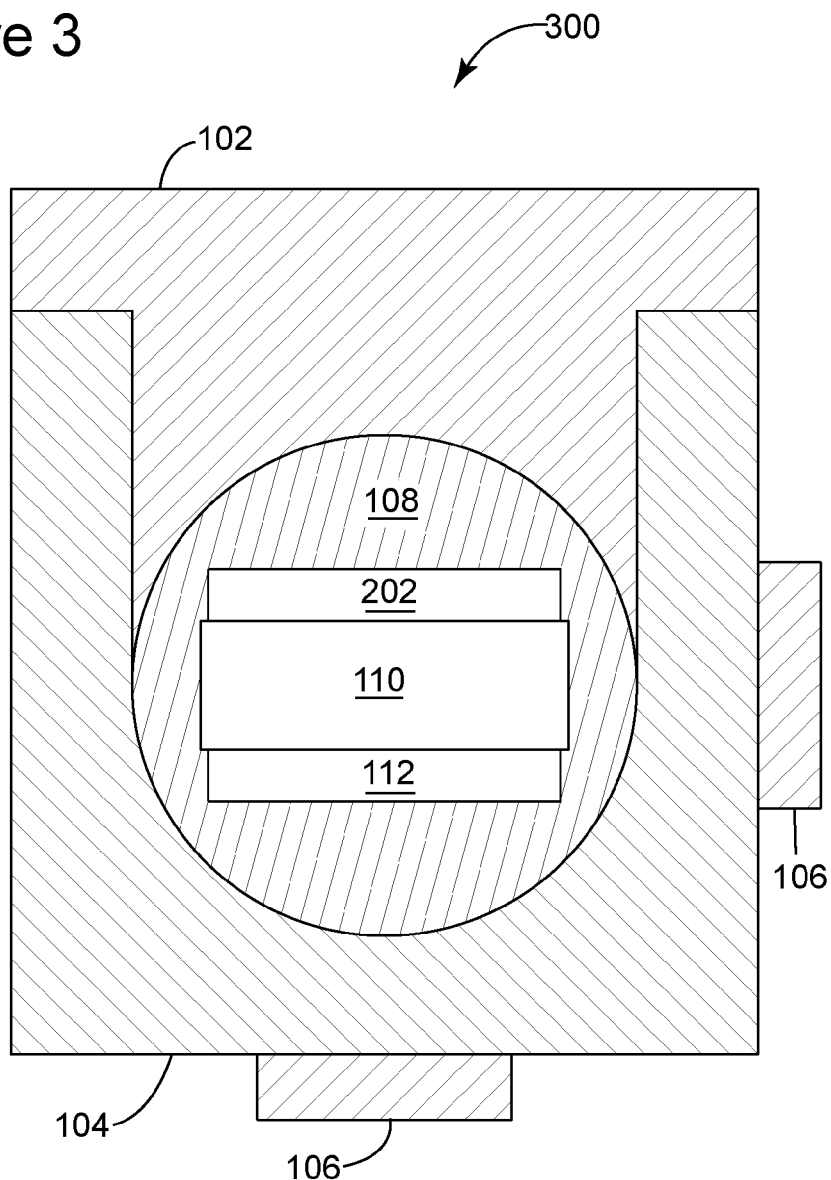
FIG. 3 is an exemplary embodiment of a rugged three-axis inclinometer based on a ferrofluid encapsulated magnet, with an attached non-magnetic weight and float, in a non-magnetic cavity.

Looking now to FIG. 3, an exemplary embodiment depicts a cross section of a rugged three-axis inclinometer 300. In the exemplary embodiment, the rugged three-axis inclinometer 300 includes a non-magnetic casing 102, 104, angle sensors 106, ferrofluid 108, a magnet 110, a non-magnetic weight 112 and a non-magnetic float 202. It should be noted that one of the angle sensors is not shown due to the cross sectional nature of FIG. 1, the third angle sensor would be on the end of the casing 102, 104 in the plane of the cross section.

Continuing with the exemplary embodiment, the rugged three-axis inclinometer 300 is a combination of the rugged three-axis inclinometer 100 and the rugged three axis inclinometer 200 described above in that the rugged three-axis inclinometer 300 includes both the weight 112 and the float 202, attached to opposite cylindrical faces of the magnet 110. The exemplary embodiment combination of the float 202 and the weight 112 provides a greater force in response to gravity to maintain the magnet 110 perpendicular to the direction of the gravitational force as the casing 102, 104 is rotated in any direction.

Figure 4:
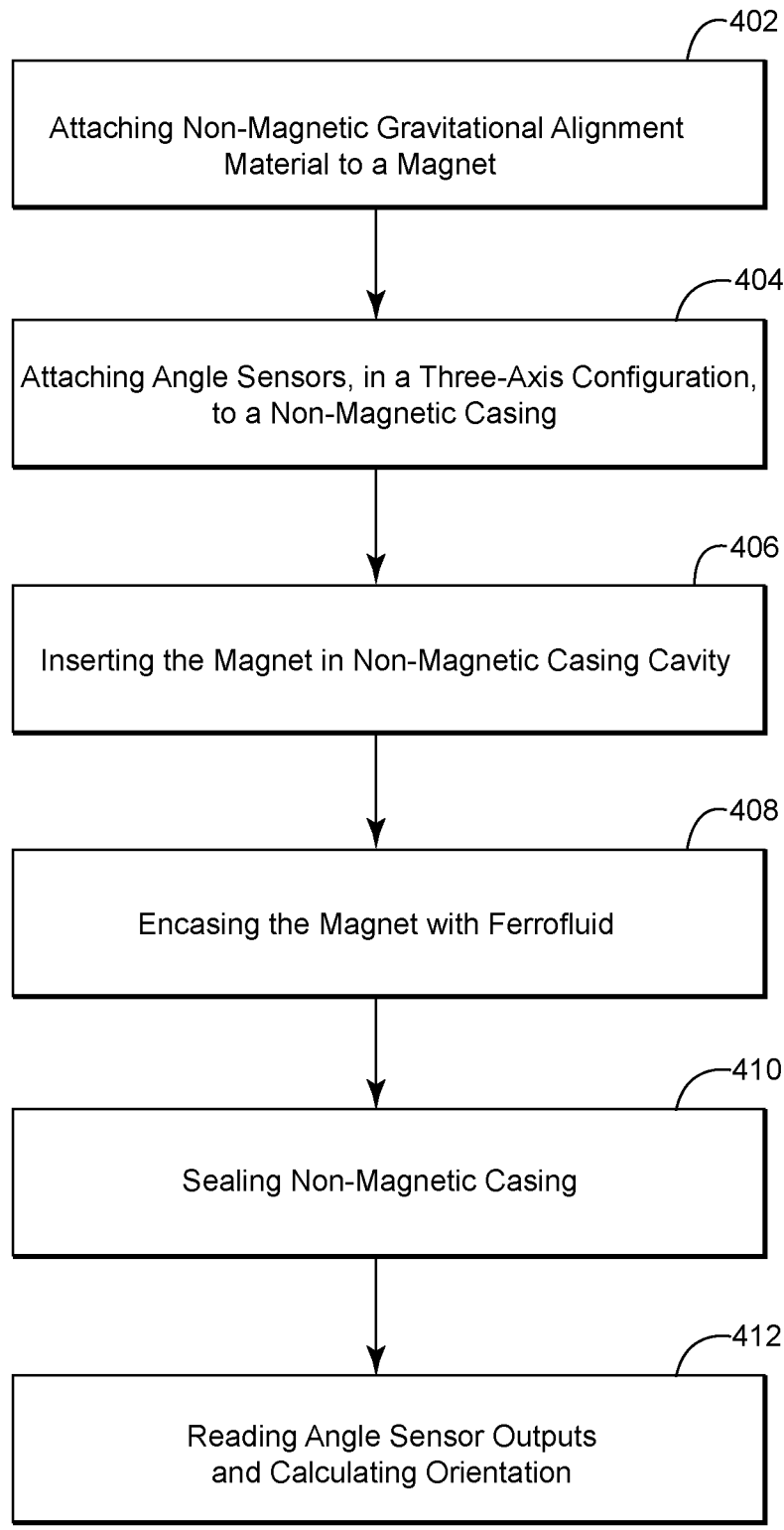
FIG. 4 is a flow chart illustrating steps for creating a rugged three-axis inclinometer based on a ferrofluid encapsulated magnet, with an attached gravitational alignment material, according to an exemplary embodiment.

Looking now to FIG. 4, a flowchart for an exemplary method embodiment 400 for creating and using a rugged three-axis inclinometer is depicted. Starting a step 402, the exemplary method embodiment 400 attaches a non-metallic gravitational alignment material to a magnet. The non-metallic gravitation alignment material in the exemplary method embodiment 400 can be but is not limited to a weight added to a polar end of the magnet, a float added to a polar end of the magnet or a weight and a float added to opposite polar ends of the magnet.

Continuing at step 404, the exemplary method embodiment 400 attaches angle sensors, in a three-axis configuration, to a non-metallic casing that will hold the magnet and gravitational alignment material. It should be noted that the angle sensors can be but are not limited to TMR sensors described previously. The angle sensors will measure the change in the magnetic field generated by the magnet as the magnet changes position.

Next, at step 406, the exemplary method embodiment 400 inserts the magnet and associated gravitational alignment material into a cavity in a non-metallic casing. In one non-limiting example, the cavity is spherical in shape and centered on the three-axis intersection point associated with the placement of the angle sensors.

Continuing at step 408 of the exemplary method embodiment 400, a ferrofluid, as previously described, is added to the cavity in the non-metallic casing and encases the magnet and associated gravitational alignment material. The ferrofluid surrounds the magnet and associated gravitational alignment material and acts as a low friction medium in which the magnet and gravitational alignment material can freely rotate.

Next, at step 410 of the exemplary method embodiment 400, the non-metallic casing is sealed to retain the internal components as the non-metallic casing is rotated. It should be noted in the exemplary method embodiment 400 that one non-limiting example of sealing the non-metallic casing is attaching a non-metallic casing top to a non-metallic casing body with the non-metallic casing top and the non-metallic casing body created in such a way that pressing them together forms a seal. In another non-limiting example, an adhesive can be used to attach a first non-metallic casing to a second non-metallic casing.

Continuing at step 412 of the exemplary embodiment, the output of the angle sensors can be used in a calculation to determine the orientation, with respect to a gravitational field, of the non-magnetic casing and any object to which the non-metallic casing is attached.

Once the exemplary embodiment rugged three-axis inclinometer is assembled, the non-metallic casing can be attached to an object and the orientation of the object can be determined based on the output from the angle sensors. In the exemplary embodiment, the casing rotates and the magnet is held in a fixed position, with respect to the gravitational field, by the gravitational alignment material. Accordingly, as the non-metallic casing rotates the gravitation field experienced by each of the angle sensors changes and a position of the object, with respect to the gravitational field can be calculated from the output of the angle sensors.

The disclosed exemplary embodiments provide a device and a method for determining the position of an object with respect to the gravitational field. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements to those recited in the literal languages of the claims.

What is claimed is:

1. An apparatus for measuring orientation with respect to gravity, said apparatus comprising:
    a magnet assembly comprising:
        a magnet; and
        one or more non-magnetic gravitational alignment materials attached to said magnet;
    a non-magnetic casing with a cavity for enclosing said magnet assembly;
    a ferrofluid enclosed in said cavity and encasing said magnet assembly; and
    a plurality of angle sensors, attached to said non-magnetic casing, for measuring a magnetic field associated with said magnet, wherein each of the plurality of angle sensors is a Tunneling Magnetoresistance (TMR) sensor, and wherein said plurality of angle sensors further comprises three angle sensors configured such that an angle sensor is centered on each axis of rotation of said non-magnetic casing.

2. The apparatus of claim 1, wherein said magnet is cylindrical in shape.

3. The apparatus of claim 1, wherein said non-magnetic gravitational alignment material has a density greater than said ferrofluid.

4. The apparatus of claim 1, wherein said non-magnetic gravitational alignment material has a density less than said ferrofluid.

5. An apparatus for measuring orientation with respect to gravity, said apparatus comprising:
    a magnet assembly comprising:
        a magnet, wherein said magnet is cylindrical in shape;
        one or more non-magnetic gravitational alignment materials attached to said magnet, wherein a first non-magnetic gravitational alignment material with a density greater than said ferrofluid and a second non-magnetic gravitational alignment material with a density less than said ferrofluid are attached to opposite cylindrical faces of said magnet;
    a non-magnetic casing with a cavity for enclosing said magnet assembly;
    a ferrofluid enclosed in said cavity and encasing said magnet assembly; and
    a plurality of angle sensors, attached to said non-magnetic casing, for measuring a magnetic field associated with said magnet, wherein each of the plurality of angle sensors is a Tunneling Magnetoresistance (TMR) sensor.

6. The apparatus of claim 5, wherein said cavity is spherical.

7. The apparatus of claim 6, wherein said ferrofluid fills said cavity outside of said magnet assembly.

8. A well logging tool apparatus comprising:
    a sensor assembly for collecting data from a well bore;
    an orientation measuring apparatus, comprising:
        a magnet assembly comprising:
            a magnet; and
            one or more non-magnetic gravitational alignment materials attached to said magnet;
        a non-magnetic casing with a cavity for enclosing said magnet assembly;
        a ferrofluid enclosed in said cavity and encasing said magnet assembly; and
        a plurality of angle sensors, attached to said non-magnetic casing, for measuring a magnetic field associated with said magnet, wherein said plurality of angle sensors further comprises three angle sensors configured such that an angle sensor is centered on each axis of rotation of said non-magnetic casing; and
    a casing for enclosing said sensor assembly and said orientation measuring apparatus.

9. The apparatus of claim 8, wherein said magnet is cylindrical in shape.

10. The apparatus of claim 8, wherein said non-magnetic gravitational alignment material has a density greater than said ferrofluid.

11. The apparatus of claim 9, wherein said cavity is spherical.

12. The apparatus of claim 8, wherein said angle sensors are Tunneling Magnetoresistance (TMR) sensors.

13. A method for measuring orientation with respect to a gravitational field, said method comprising:
    creating a magnet assembly by attaching one or more non-magnetic gravitational alignment materials to a magnet;
    attaching a plurality of Tunneling Magnetoresistance (TMR) angle sensors to a non-magnetic casing, wherein attaching said plurality of angle sensors further comprises attaching three angle sensors with one angle sensor positioned on each dimensional axis of rotation;
    inserting said magnet assembly in a cavity in said non-magnetic casing;
    encasing, in said cavity, said magnet assembly with a ferrofluid;
    sealing said cavity to contain said magnet assembly and said ferrofluid; and
    reading said plurality of angle sensors outputs and calculating an orientation based on said outputs.

14. The method of claim 13, further comprising attaching said non-magnetic casing to an object for determining an orientation of said object with respect to said gravitational field.

15. The method of claim 13, wherein attaching said plurality of angle sensors further comprises attaching three angle sensors with one angle sensor positioned on each dimensional axis of rotation.

16. A method for measuring orientation with respect to a gravitational field, said method comprising:
    creating a magnet assembly by attaching one or more non-magnetic gravitational alignment materials to a magnet;
    attaching a plurality of Tunneling Magnetoresistance (TMR) angle sensors to a non-magnetic casing, wherein attaching one or more non-magnetic gravitational alignment materials further comprises attaching a first non-magnetic gravitational alignment material with a density greater than said ferrofluid and a second non-magnetic gravitational alignment material with a density less than said ferrofluid to opposite sides of said magnet;
    inserting said magnet assembly in a cavity in said non-magnetic casing;
    encasing, in said cavity, said magnet assembly with a ferrofluid;
    sealing said cavity to contain said magnet assembly and said ferrofluid; and
    reading said plurality of angle sensors outputs and calculating an orientation based on said outputs.

* * * * *